(12) United States Patent
Tajima et al.

(10) Patent No.: US 10,128,153 B2
(45) Date of Patent: Nov. 13, 2018

(54) METHOD OF FABRICATING A SEMICONDUCTOR DEVICE AND THE SEMICONDUCTOR DEVICE

(71) Applicant: Kabushiki Kaisha Toshiba, Minato-ku (JP)

(72) Inventors: Takayuki Tajima, Sagamihara (JP); Kazuo Shimokawa, Yokohama (JP); Tatsuya Kobayashi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/181,853

(22) Filed: Jun. 14, 2016

(65) Prior Publication Data

US 2016/0365340 A1 Dec. 15, 2016

(30) Foreign Application Priority Data

Jun. 15, 2015 (JP) .................. 2015-120155

(51) Int. Cl.
*H01L 23/498* (2006.01)
*H01L 21/56* (2006.01)
(Continued)

(52) U.S. Cl.
CPC .......... *H01L 21/78* (2013.01); *H01L 21/3043* (2013.01); *H01L 23/5384* (2013.01);
(Continued)

(58) Field of Classification Search
CPC . H01L 21/3043; H01L 21/561; H01L 21/563; H01L 21/78; H01L 23/13;
(Continued)

(56) References Cited

U.S. PATENT DOCUMENTS 8,941,246 B2   1/2015  Miura et al.
9,786,643 B2 * 10/2017  Ma ...................... H01L 25/0657
(Continued)

FOREIGN PATENT DOCUMENTS

JP   2004-71888 A    3/2004
JP   2004-342690 A  12/2004
(Continued)

*Primary Examiner* — Mark Tornow
*Assistant Examiner* — Abbigale Boyle
(74) *Attorney, Agent, or Firm* — Oblon, McClelland, Maier & Neustadt, L.L.P.

(57) ABSTRACT a method of fabricating a semiconductor device is described below.
The method includes stacking a plurality of semiconductor chips on each of regions in a substrate having a plurality of first grooves extending in a first direction and a plurality of second grooves extending in a second direction intersecting the first direction, the region being defined by the first grooves and the second grooves, providing an encapsulation portion covering a side of the substrate on which the semiconductor chips are stacked, removing a surface portion of the substrate on the opposite side to the side on which the semiconductor chips are stacked to expose the first grooves and the second grooves, and cutting the encapsulation portion along the first grooves and of second grooves.
The device and the method can provide higher productivity.

9 Claims, 6 Drawing Sheets

(51) Int. Cl.
  H01L 21/78 (2006.01)
  H01L 21/304 (2006.01)
  H01L 23/538 (2006.01)
  H01L 23/31 (2006.01)
  H01L 23/13 (2006.01)
  H01L 23/14 (2006.01)
  H01L 23/00 (2006.01)

(52) U.S. Cl.
  CPC .......... *H01L 23/5389* (2013.01); *H01L 24/97* (2013.01); *H01L 21/561* (2013.01); *H01L 21/568* (2013.01); *H01L 23/13* (2013.01); *H01L 23/147* (2013.01); *H01L 23/3128* (2013.01); *H01L 23/3135* (2013.01); *H01L 23/49816* (2013.01); *H01L 23/562* (2013.01); *H01L 2224/04105* (2013.01); *H01L 2224/12105* (2013.01); *H01L 2224/13025* (2013.01); *H01L 2224/14181* (2013.01); *H01L 2224/16146* (2013.01); *H01L 2224/17181* (2013.01); *H01L 2224/32145* (2013.01); *H01L 2224/32225* (2013.01); *H01L 2224/73204* (2013.01); *H01L 2224/73209* (2013.01); *H01L 2224/73253* (2013.01); *H01L 2224/73259* (2013.01); *H01L 2224/8203* (2013.01); *H01L 2224/83007* (2013.01); *H01L 2224/92124* (2013.01); *H01L 2224/97* (2013.01); *H01L 2924/3511* (2013.01)

(58) Field of Classification Search
  CPC . H01L 23/3135; H01L 23/3128; H01L 24/97; H01L 2223/5446; H01L 2224/16146
  See application file for complete search history.

(56) References Cited

U.S. PATENT DOCUMENTS

| | | |
|---|---|---|
| 2010/0148340 A1 | 6/2010 | Takano et al. |
| 2011/0127647 A1* | 6/2011 | Tsukakoshi ............ H01L 21/78 257/620 |
| 2012/0032340 A1 | 2/2012 | Choi et al. |
| 2015/0318261 A1* | 11/2015 | Chung .............. H01L 21/76898 257/774 |

FOREIGN PATENT DOCUMENTS

| | | |
|---|---|---|
| JP | 2005-166692 A | 6/2005 |
| JP | 2007-214220 A | 8/2007 |
| JP | 2008-130704 | 6/2008 |
| JP | 2008-130704 A | 6/2008 |
| JP | 2008-235401 A | 10/2008 |
| JP | 2012-209449 | 10/2012 |
| JP | 2015-56563 A | 3/2015 |
| JP | 2016-58655 A | 4/2016 |

* cited by examiner

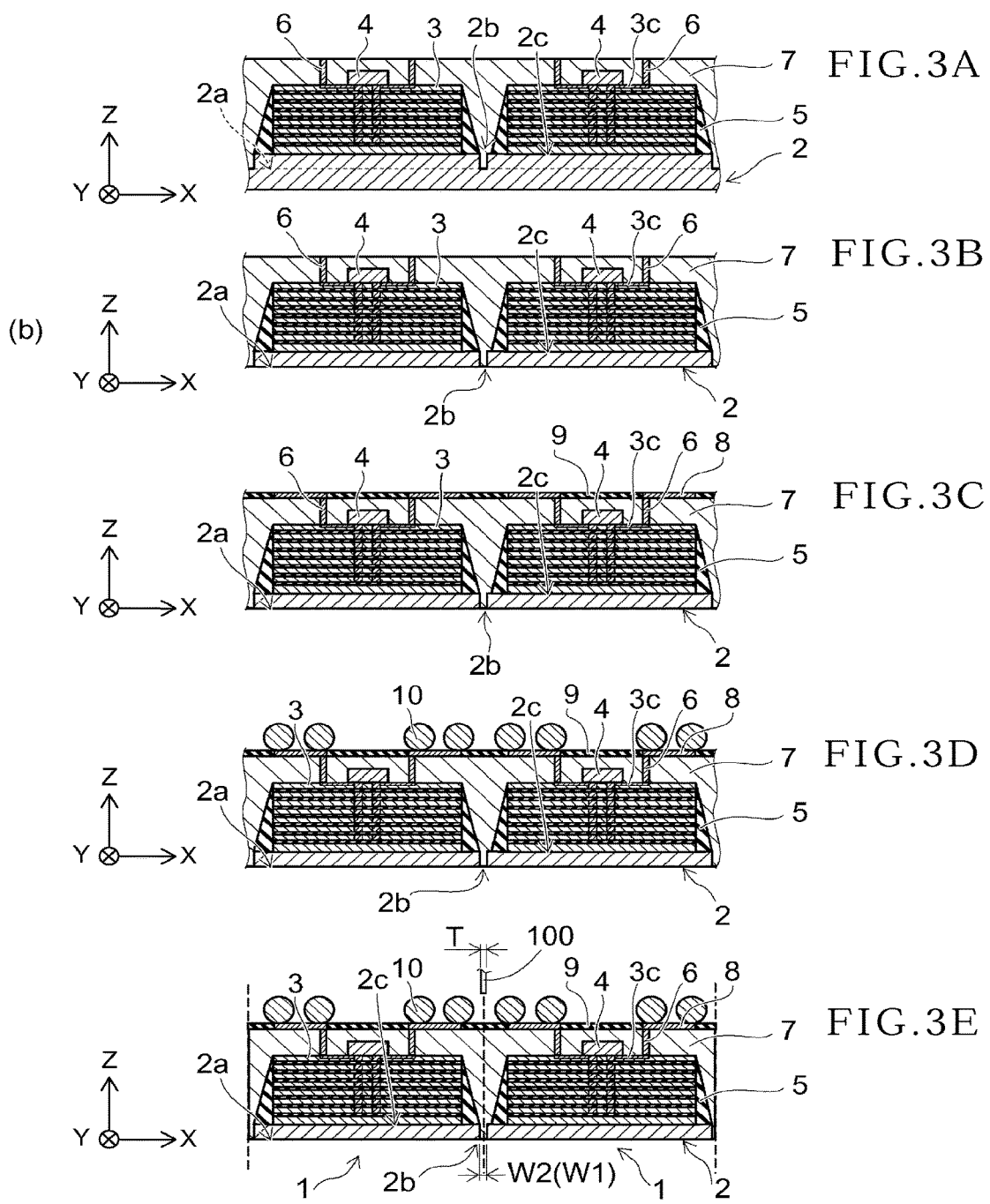

METHOD OF FABRICATING A SEMICONDUCTOR DEVICE AND THE SEMICONDUCTOR DEVICE

CROSS REFERENCE TO RELATED APPLICATION

This application is based upon and claims the benefit of priority from prior Japanese Patent Application No. 2015-120155, filed on Jun. 15, 2015, the entire contents of which are incorporated herein by reference.

FIELD

Embodiments described herein generally relate to a semiconductor device and a method of fabricating the semiconductor device.

BACKGROUND

Recently, smaller size, higher capacity, and more functions with respect to a semiconductor device have been demanded. In such the situation, a semiconductor device, in which semiconductor chips are stacked, has been proposed. In a step of stacking the semiconductor chips, warpage are sometimes generated in the stacked body of the semiconductor chips. When the warpage is generated in the stacked body, encapsulation on the stacked body and formation of interconnections to be electrically connected between the semiconductor chips in the stacked body may be difficult and the productivity of the stacked body may be decreased. Moreover, when the semiconductor chips are stacked on the substrate, the warpage of the semiconductor chips makes it difficult to align electrodes of the chips with electrodes on the substrate. Accordingly, problems, in which the productivity cannot be improved, remains as an unsolved matter, for example. Hence, development of a semiconductor device including the stacked body and a method of fabricating the semiconductor device having high productivity are desired.

SUMMARY

According to one embodiment, a method of fabricating a semiconductor device is described below. The method includes stacking a plurality of semiconductor chips on each of regions in a substrate having a plurality of first grooves extending in a first direction and a plurality of second grooves extending in a second direction intersecting the first direction, the region being defined by the first grooves and the second grooves, providing an encapsulation portion covering a side of the substrate on which the semiconductor chips are stacked, removing a surface portion of the substrate on the opposite side to the side on which the semiconductor chips are stacked to expose the first grooves and the second grooves, and cutting the encapsulation portion along the first grooves and of second grooves.

According to another embodiment, a semiconductor device described below. The semiconductor device includes a substrate, a plurality of semiconductor chips stacked on the substrate, an encapsulation portion covering a side surface of the substrate and a side of the substrate on which the semiconductor chips are stacked.

The embodiments described above can provide a semiconductor device which including a stacked body with a plurality of chips and a method of fabricating the semiconductor device. The device and the method can provide higher productivity.

BRIEF DESCRIPTION OF THE DRAWINGS

FIGS. 3A to 3E are schematic process views illustrating the method of fabricating the semiconductor device according to the first embodiment;

DETAILED DESCRIPTION

Figure 1A:
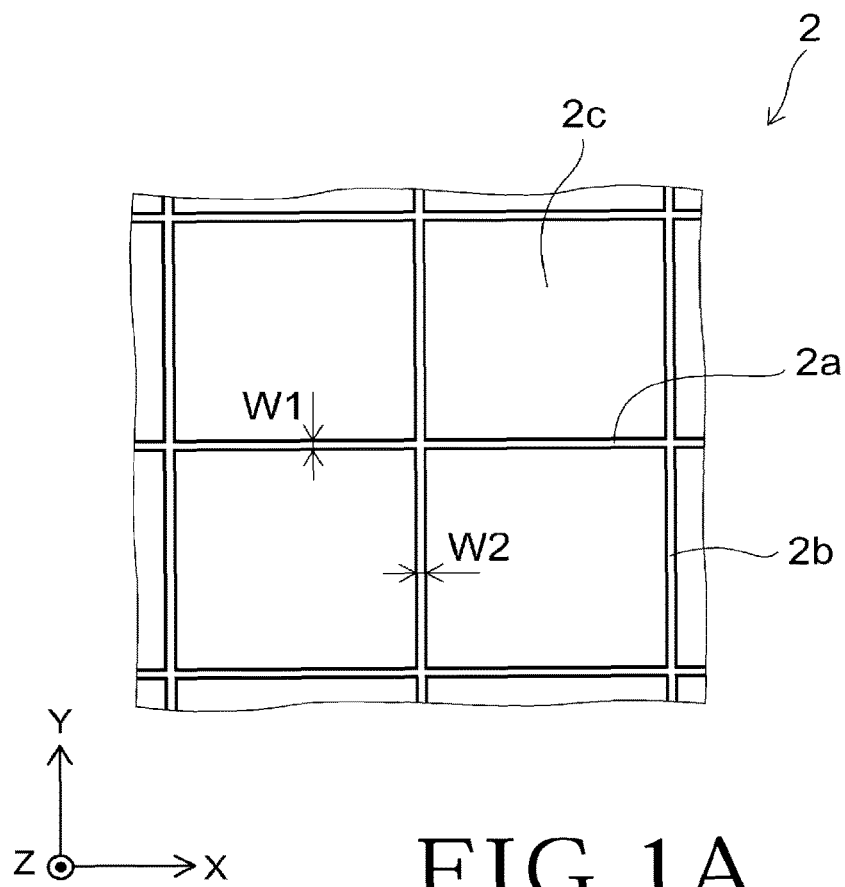
FIGS. 1A and 1B are schematic process views illustrating a method of fabricating a semiconductor device according to a first embodiment.

Embodiments are described below with reference to the drawings. Note that, in the drawings, similar configuration elements are denoted by the same reference numerals and detailed description thereof is omitted as appropriate. Moreover, the arrows Y, Z, and X in the drawings indicate three directions orthogonal to one another. For example, a direction perpendicular to main surfaces of a substrate 2 (stacking direction) is referred to as Z direction. Moreover, one of directions in a plane parallel to the main surfaces of the substrate 2 is referred to as X direction, and a direction perpendicular to the Z direction and the X direction is referred to as Y direction. A case where a semiconductor device 1 is a non-volatile semiconductor memory device such as a NAND flash memory is described as an example. The semiconductor device 1 is not limited to the non-volatile semiconductor memory device.

(First Embodiment)

FIG. 1A, FIG. 1B, FIGS. 2A to 2D, and FIGS. 3A to 3E are schematic process views illustrating a method of fabricating a semiconductor device according to a first embodiment. Note that FIG. 1A is a schematic plan view and FIGS. 1B to 3E are schematic cross-sectional views.

Figure 1B:
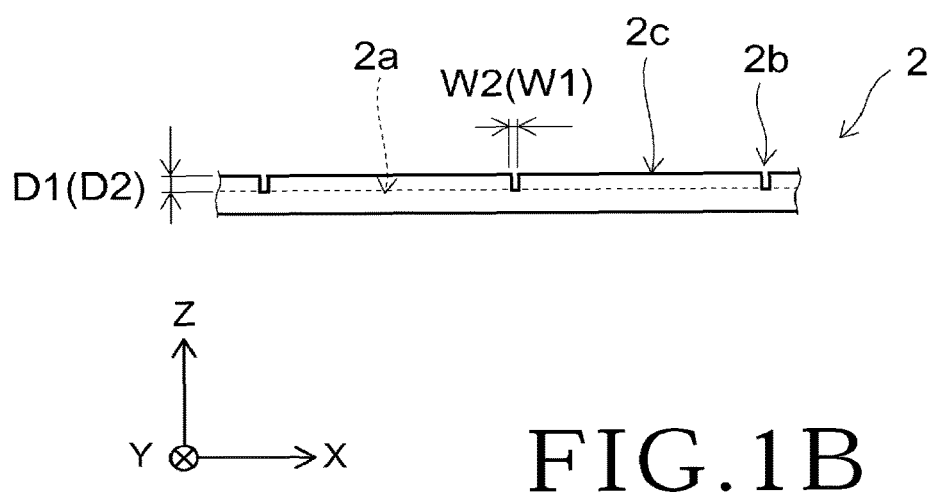

As illustrated in FIGS. 1A and 1B, grooves 2a (corresponding to an example of first grooves) and grooves 2b (corresponding to an example of second grooves) are provided on the substrate 2. The grooves 2a and the grooves 2b are provided by using, for example, blade dicing.

The grooves 2a and the grooves 2b are provided on one of the main surfaces of the substrate 2. The grooves 2a are provided at a prescribed interval to be parallel to one another. The grooves 2a extend in the X direction (corresponding to an example of a first direction). The grooves 2b are provided at a prescribed interval to be parallel to one another. The grooves 2b extend in the Y direction (corresponding to an example of a second direction).

The depth D1 of the grooves 2a and the depth D2 of the grooves 2b are smaller than the thickness of the substrate 2. The depth D2 of the grooves 2b is the same as the depth D1 of the grooves 2a or is different from the depth D1 of the grooves 2a. The width W1 of the grooves 2a and the width W2 of the grooves 2b are greater than the thickness T of a later-described blade 100 used in dicing. The width W2 of the grooves 2b is the same as the width W1 of the grooves 2a or is different from the width W1 of the grooves 2a. In this case, setting the depth D2 of the grooves 2b equal to the depth D1 of the grooves 2a and setting the width W2 of the grooves 2b equal to the width W1 of the grooves 2a can improve production efficiency in the method of fabricating the semiconductor device.

Formation of the grooves 2a and the grooves 2b reduces the stiffness of the substrate 2. Accordingly, the depths and the widths of the grooves 2a and the grooves 2b are set such that no deformation or warpage of the substrate 2 occurs in stacking of semiconductor chips 3 and forming an encapsulation portion 7 and the like to be described later.

Each of regions 2c defined by two grooves 2a and two grooves 2b is a region on which the semiconductor chips 3 are stacked, that is a region in which a stacked body 30 of the semiconductor chips 3 is provided. Accordingly, the intervals among the grooves 2a and the intervals among the grooves 2b are determined in consideration of the plane sizes of the semiconductor chips 3. The regions 2c are arranged as a matrix.

When curing (heat treatment) of an adhesive agent and melting of bump electrodes 3b to be described later are performed, thermal stress is generated between the semiconductor chips 3 and the substrate 2 due to difference between thermal expansion coefficients. Accordingly, the thickness of the substrate 2 is designed such that deformation, warpage, and the like due to the thermal stress can be suppressed even when the substrate 2 includes the grooves 2a and the grooves 2b. Control of deformation, warpage, and the like in the substrate 2 leads to suppress deformation and warpage of the stacked bodies 30. Further, Control of deformation and warpage of the stacked bodies 30 leads to suppress separation of the bump electrodes 3b and adhesive layers 13 and to facilitate forming of an interconnection layer 8. Furthermore, the thermal expansion coefficient of the substrate 2 can be approximately set the same as the thermal expansion coefficient of the semiconductor chips 3 to reduce the thermal stress. In this case, since the main component of the semiconductor chips 3 is silicon, a substrate containing silicon can be used the substrate 2. Moreover, processing of the substrate can be improved by using the substrate 2 containing silicon.

Figure 2A:
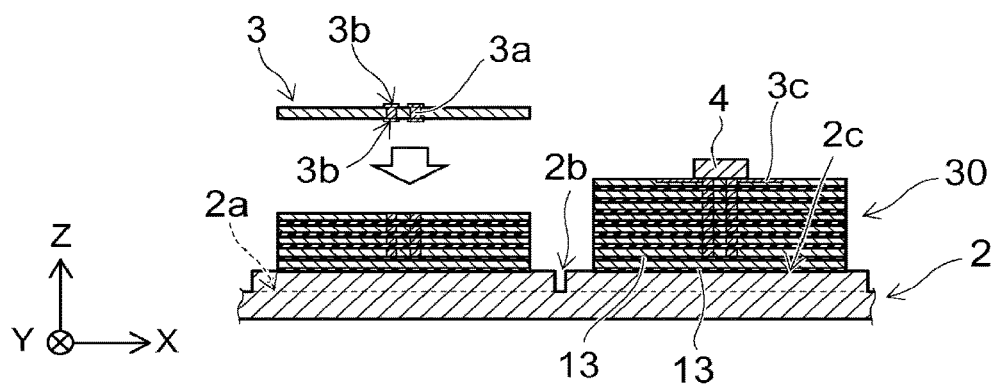
FIGS. 2A to 2D are schematic process views illustrating the method of fabricating the semiconductor device according to the first embodiment.

As illustrated in FIG. 2A, the stacked bodies 30 including the semiconductor chips 3 are provided on the regions 2c. For example, the semiconductor chips 3 are stacked on each of the regions 2c of the substrate 2 having the grooves 2a extending in the X direction and the grooves 2b extending in the Y direction, the regions 2c defined by the grooves 2a and the grooves 2b. One stacked body 30 is provided on one region 2c. Each stacked body 30 is provided by sequentially stacking the semiconductor chips 3 on the region 2c. In the embodiment, in the sequential stacking of the semiconductor chips 3, at least any of the grooves 2a, the grooves 2b, and a contour of the region 2c is used as a mark for alignment. Accordingly, the position accuracy of the semiconductor chips 3 bonded onto the region 2c, the position accuracy among the plurality of semiconductor chips 3, and the position accuracy and shape accuracy of the stacked body 30 are improved. The number of semiconductor chips 3 included in the stacked body 30 is not limited to that illustrated in the example. The number of semiconductor chips 3 can be changed as appropriate depending on the memory capacity of each semiconductor chip 3, the memory capacity of the semiconductor device 1, application, and the like.

Each semiconductor chip 3 has via electrodes 3a and bump electrodes 3b which are electrically connected to a not-illustrated memory cell array. The via electrodes 3a penetrate in the semiconductor chip 3 in a thickness direction. The bump electrodes 3b protrude from both main surfaces (upper surface and lower surface) of the semiconductor chip 3. Semiconductor chips having the same configuration or different configurations are used as the semiconductor chips 3 included in the stacked body 30. The semiconductor chip 3, for example, provided on the region 2c may have the bump electrodes 3b electrically connected to a memory cell array (not-illustrated) but have no via electrodes 3a.

The semiconductor chips 3 are bonded by using an adhesive agent having insulating property. The curing is performed to cure the adhesive agent, and the adhesive layers 13 having insulating property are thus provided between the region 2c and the semiconductor chip 3 and between each pair of adjacent semiconductor chips 3.

Stacking the semiconductor chips 3 brings the bump electrodes 3b of the semiconductor chips 3 adjacent to each other in the Z direction (stacking direction) into contact with one another. The stacked body 30 is heated in a state the bump electrodes 3b are brought into contact with one another such that the bump electrodes 3b is melted and integrated into the stacked body 30. Note that the integration of the bump electrodes 3b is not necessarily required. Meanwhile, the integration of the bump electrodes 3b can improve reliability related to electrical connection. The semiconductor chips 3 are mechanically and electrically connected to one another as described above.

The material of the via electrodes 3a is not limited to a particular material, provided that the material is an electrically conductive material. For example, the via electrodes 3a are made of metals such as Au, Cu, Ni, Sn, Pd, and Ag or alloys including these metals. In the integration of the bump electrodes 3b, at least one of the two bump electrodes 3b adjacent to each other in the Z direction can be made of a solder material. Sn alloy, Sn—Cu alloy, Sn—Ag alloy, Sn—Ag—Cu alloy, or the like is used as the solder material. When the bump electrodes 3b are not to be integrated with one another or when one of the two bump electrodes 3b adjacent to each other in the Z direction is not made of the solder material, for example, the bump electrodes 3b can be made of metals such as Au, Cu, Ni, Sn, Pd, and Ag or alloys including these metals. Each of the bump electrodes 3b is a single layer film or a laminated layer film made of metal films. For example, Ni/Au, Ni/Pd/Au, and the like are used as the laminated layer film.

The shapes of the bump electrodes 3b are not limited to a particular shape, and can be a convex shape such as a hemisphere or a column, or a flat shape such as a pad. In this case, the contact between the two bump electrodes 3b adjacent to each other in the Z direction can be facilitated by forming at least one of the bump electrodes 3b in the convex shape.

Moreover, in consideration of workability in stacking of the semiconductor chips 3, the bump electrodes 3b made of a laminated layer film of Ni/Au, Ni/Pd/Au, or the like are provided on a circuit surface (upper surface) of each semiconductor chip 3 on which a memory cell array (not-illustrated) is provided. In such the method, the bump electrodes 3b made of the solder material can be provided on the surface (lower surface) of the semiconductor chip 3 opposite to the circuit surface. In such the manner, the bump electrodes 3b made of the laminated layer film can have a flat shape, while the bump electrodes 3b made of the solder material can have a convex shape. In such the method, the flat-shaped bump electrodes 3b are provided on the upper surface of the semiconductor chip 3 provided on the lower side and the convex-shape bump electrodes 3b are provided on the lower surface of the semiconductor chip 3 provided on the upper side. Accordingly, the structural stability of the semiconductor chip 3 provided on the upper side, the reliability of connection among the bump electrodes 3b, the workability in stacking of the plurality of semiconductor chips 3, and the like are improved.

The semiconductor chips 3 can have the same plane shape and the same plane dimension. The plane shape of the semiconductor chips 3 can be, for example, a square shape.

The semiconductor chips 3 can have a same thickness or have different thicknesses from one another. In such the case, the thickness of the semiconductor chip 3 bonded onto the region 2c can be larger than the thickness of the other semiconductor chips 3.

An interface chip 4 is provided on each stacked body 30. The interface chip 4 has an interface circuit to perform data communication between the semiconductor chips 3 included in the stacked body 30 and a device provided outside the semiconductor device 1. Note that the interface chip 4 may be any chip, provided that the chip includes at least the interface circuit. A chip having a controller circuit is used as the interface chip 4, for example.

The interface chip 4 has internal connection electrodes (not illustrated) on a surface (lower surface) facing the stacked body 30. The internal connection electrodes (not illustrated) are electrically connected to the bump electrodes 3b of the semiconductor chip 3 provided in a top portion of the stacked body 30.

Moreover, the interface chip 4 has external connection electrodes (not illustrated) to perform data communication with a device provided outside the semiconductor device 1. An interconnection 3c for electrically connecting the device provided outside the semiconductor device 1 and the not-illustrated external connection electrodes of the interface chip 4 to one another is provided on the upper surface of the semiconductor chip 3 provided in the top portion of the stacked body 30. In such the manner, the interface chip 4 is connected by flip chip bonding to the bump electrodes 3b and the interconnection 3c provided in the top portion of the stacked body 30.

Figure 2B:
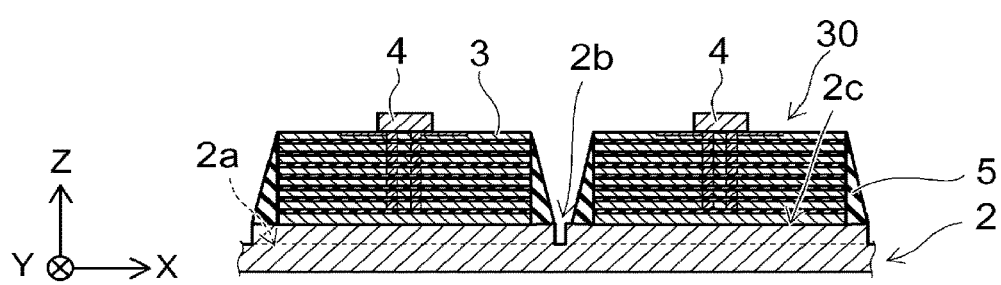

As illustrated in FIG. 2B, gaps among the semiconductor chips 3 in the stacked bodies 30 and gaps among the stacked bodies 30 and the interface chips 4 are filled with an underfill resin to fill in the gaps. The gaps are filled with the underfill resin to reinforce the semiconductor device. When the gaps are filled with the underfill resin, excessive underfill resin adheres to side surfaces of the stacked bodies 30. The underfill resin is cured to provide resin portions 5.

When the adjacent stacked bodies 30 are connected to each other by the underfill resin, no encapsulation portion 7 to be described later is provided in a portion where the connection is achieved by the underfill resin. Accordingly, the resin portions 5 are exposed from the encapsulation portion 7 when each of the semiconductor devices 1 is diced into an individual chips.

The encapsulation portion 7 is provided by using a material selected in consideration of humidity resistance, weather resistance, stiffness, and the like. Meanwhile, since the resin portions 5 are used for reinforcement, consideration of the aforementioned matters is not necessarily required. Accordingly, when the resin portions 5 are exposed from the encapsulation portion 7, the reliability of the semiconductor device 1 may be decreased.

According to the first embodiment, the grooves 2a and the grooves 2b provided between the adjacent stacked bodies 30 suppress the underfill resin from flowing toward the adjacent stacked body 30. The underfill resin adhering to side surfaces of the semiconductor chips 3 stacked is suppressed from flowing out to the adjacent region 2c by at least either of the grooves 2a and the grooves 2b.

Accordingly, it is possible to suppress exposure of the resin portions 5 from the encapsulation portion 7 and therefore improve the reliability of the semiconductor device 1.

Figure 2C:
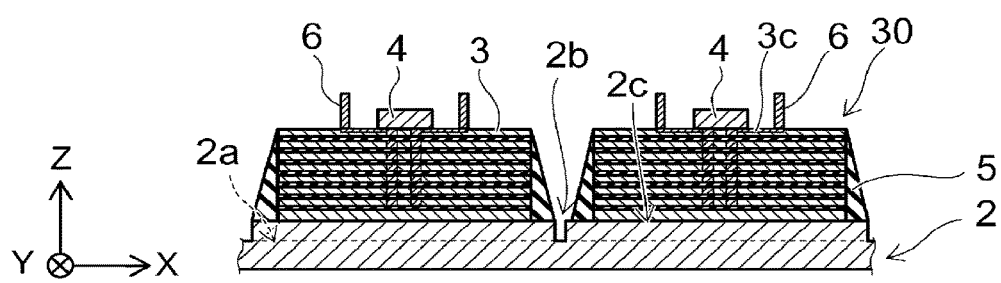
Figure 2D:
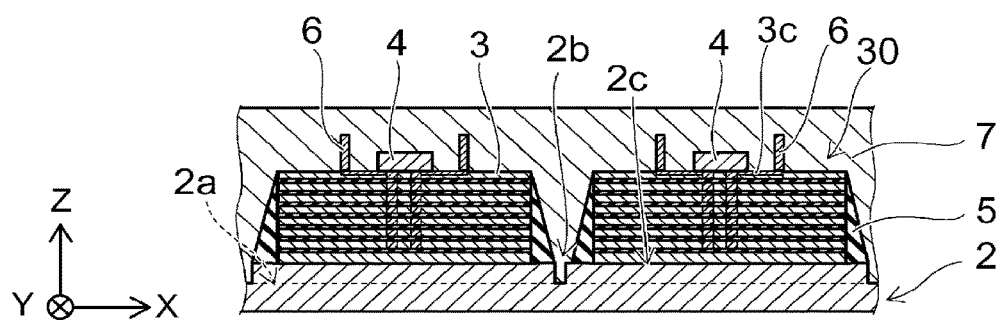

As illustrated in FIG. 2C, through via electrodes 6 are electrically connected to the interconnection 3c provided in the top portion of each stacked body 30. The through via electrodes 6 are is provided of an Au-stud bump or a columnar body which has a metal core of Cu or the like and a solder layer covering the metal core, for example, As illustrated in FIG. 2D, the encapsulation portion 7 covering the stacked bodies 30, the interface chips 4, the resin portions 5, and the through via electrodes 6 are provided. Specifically, the encapsulation portion 7 covering the side of the substrate 2 on which the semiconductor chips 3 are stacked, is provided. The encapsulation portion 7 is provided by using, for example, molding. An insulating resin such as epoxy resin is used as the material of the encapsulation portion 7, for example.

As illustrated in FIG. 3A, upper end surfaces of the through via electrodes 6 are exposed by removing an upper surface portion of the encapsulation portion 7. The upper end surfaces of the through via electrodes 6 are exposed by, for example, grinding the upper surface portion of the encapsulation portion 7.

As illustrated in FIG. 3B, the grooves 2a and the grooves 2b are exposed by removing a surface portion of the substrate 2 on the opposite side to the side on which the stacked bodies 30 are provided. The grooves 2a and the grooves 2b are exposed by, for example, grinding the surface of the substrate 2 on the opposite side to the side on which the stacked bodies 30 are provided. In this case, providing the encapsulation portion 7 in the grooves 2a and the grooves 2b makes it possible to terminate the processing at the point where the encapsulation portion 7 is exposed.

As illustrated in FIG. 3C, the interconnection layer 8 and an insulating layer 9 are provided on the upper surface of the encapsulation portion 7. The interconnection layer 8 is electrically connected to the upper end surfaces of the through via electrodes 6. The interconnection layer 8 is thus electrically connected to the semiconductor chips 3 stacked, via the through via electrodes 6, the interconnections 3c, the via electrodes 3a, and the bump electrodes 3b. The interconnection layer 8 is provided by using, for example, plating. The insulating layer 9 is provided between portions of the interconnection layer 8 and insulates the portions of the interconnection layer 8 from one another. In the embodiment, the semiconductor chips 3 are accurately stacked on each region 2c by using at least any of the grooves 2a, the grooves 2b, and the contour of the region 2c as the alignment mark.

Namely, the interconnection layer 8 and the insulating layer 9 are provided by using the grooves 2a and the grooves 2b as the alignment mark. The grooves 2a and the grooves 2b are exposed by removing the surface portion of the substrate 2 on the opposite side to the side on which the stacked bodies 30 are provided. Accordingly, the position accuracy of the interconnection layer 8 and the insulating layer 9 can be improved As illustrated in FIG. 3D, external connection terminals 10 are provided on the interconnection layer 8. In a BGA package, the external connection terminals 10 are solder balls, convex bodies plated by solder, Au, or the like, for example. Note that the example illustrated in FIG. 3D is the case where the external connection terminals 10 are solder balls. Moreover, in a LGA package, the external connection terminals 10 are metal lands or the like, for example. The semiconductor devices 1 are thereby integrally fabricated.

As illustrated in FIG. 3E, the semiconductor devices 1 are diced into an individual chip. The semiconductor devices 1 are obtained by being separated from one another by using blade dicing, for example. In this case, the encapsulation portion 7 is cut along the grooves 2a and the grooves 2b. Moreover, the encapsulation portion 7 is cut by using the blade 100 having the thickness T smaller than the widths W1 of the grooves 2a and the grooves 2b.

The encapsulation portion 7 is made of the insulating resin and the substrate 2 is made of silicon and the like. In the case of cutting a stacked structure provided by stacking layers different in hardness and rigidity in the thickness direction thereof, cutting conditions in the respective layers are different from one another. Accordingly, there are risks of decrease in cutting accuracy, tilting of cutting surfaces, chipping of a hard layer, clogging and chipping of the blade 100, and the like.

In the embodiment, separation is performed at the positions of the grooves 2a and the grooves 2b. Moreover, as described above, the width W of the grooves 2a and the grooves 2b are larger than the thickness T of the blade 100 used in the dicing. Accordingly, the blade 100 can cut only the encapsulation portion 7 without cutting the substrate 2. In other words, cutting can be performed under a single cutting condition. As a result, the cutting accuracy, the quality of the cutting surfaces, and the like can be improved. Moreover, since the blade 100 suitable for the cutting of the insulating resin contained in the encapsulation portion 7 can be selected, the clogging and chipping of the blade 100 can be suppressed.

Figure 4:
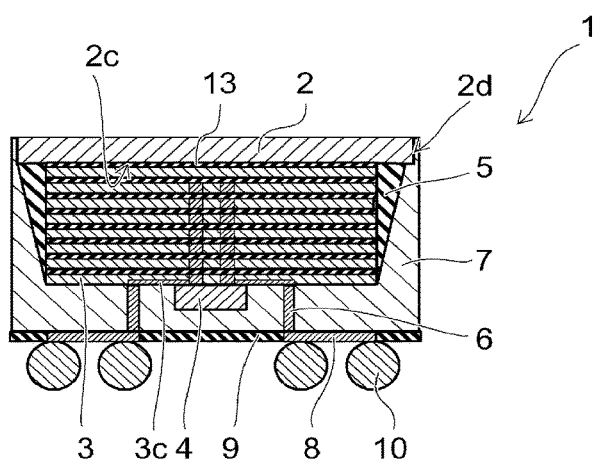
FIG. 4 is a schematic cross-sectional view illustrating the semiconductor device according to the first the embodiment.

FIG. 4 is a schematic cross-sectional view illustrating the semiconductor device 1 according to the first embodiment. The semiconductor device 1 illustrated in FIG. 4 is the semiconductor device 1 diced into an individual chip in the description of FIG. 3E. As described above, the width W1 of the grooves 2a and the width W2 of the grooves 2b are larger than the thickness T of the blade 100 used in the dicing. Accordingly, side surfaces 2d of the substrate 2 are also covered with the encapsulation portion 7. Specifically, the semiconductor device 1 includes the substrate 2, the plurality of semiconductor chips 3 stacked on the substrate 2, and the encapsulation portion 7 covering the side surfaces 2d of the substrate 2 and the side of the substrate 2 on which the plurality of semiconductor chips 3 are stacked. Covering the side surfaces 2d of the substrate 2 with the encapsulation portion 7 increases the bonding strength between the substrate 2 and the encapsulation portion 7. Covering the side surfaces 2d of the substrate 2 with the encapsulation portion 7 suppresses exposure of the resin portions 5 from the encapsulation portion 7. Accordingly, the reliability of the semiconductor device 1 is improved.

(Second Embodiment)

FIGS. 5A to 5D and FIGS. 6A to 6E are schematic process views illustrating a method of fabricating a semiconductor device in a second embodiment. First, grooves 2a and grooves 2b are provided on a substrate 2 in a way similar to that illustrated in FIGS. 1A and 1B.

Figure 5A:
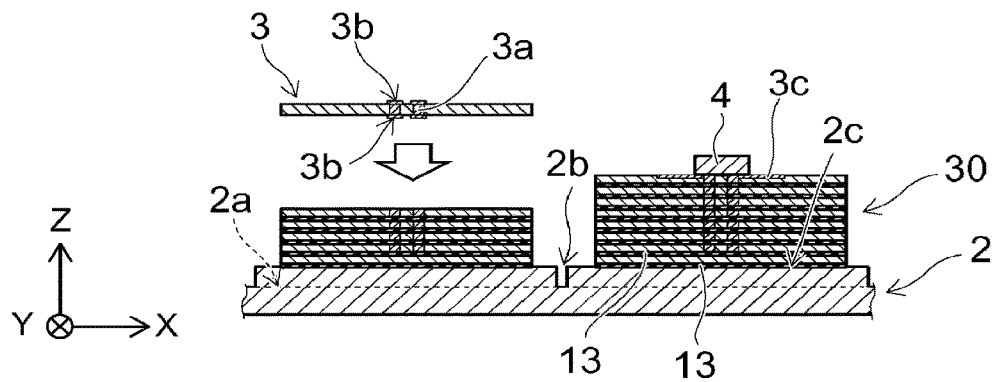
FIGS. 5A and 5D are schematic process views illustrating a method of fabricating a semiconductor device according to a second embodiment.

As illustrated in FIG. 5A, a stacked body 30 having semiconductor chips 3 is provided on each of regions 2c. In the above case, the stacked body 30 can be provided in a way similar to that illustrated in FIG. 2A.

Figure 5B:
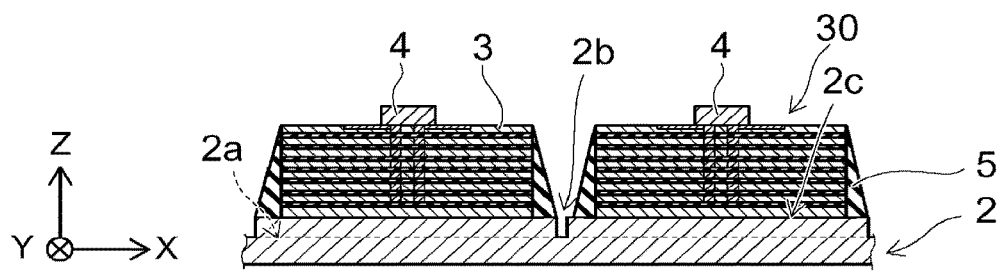

As illustrated in FIG. 5B, gaps among the semiconductor chips 3 in the stacked bodies 30 and gaps among the stacked bodies 30 and the interface chips 4 are filled with an underfill resin to fill in the gaps. In the above case, the gaps are filled with the underfill resin in a way similar to that illustrated in FIG. 2B.

Figure 5C:
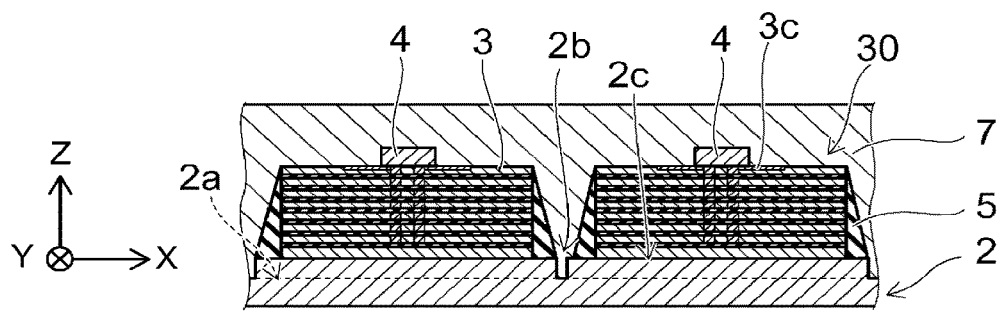

As illustrated in FIG. 5C, an encapsulation portion 7 covering the stacked bodies 30, the interface chips 4, and the resin portions 5 are provided. In the above case, the encapsulation portion 7 is provided in a way similar to that illustrated in FIG. 2D. In the aforementioned first embodiment, the encapsulation portion 7 is provided after the formation of the through via electrodes 6. Meanwhile, in the second embodiment, the through via electrodes 6 are provided after the formation of the encapsulation portion 7.

Figure 5D:
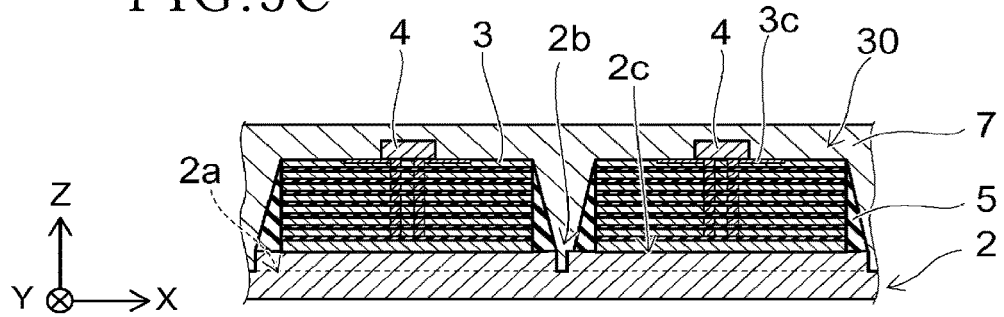

As illustrated in FIG. 5D, an upper surface of the encapsulation portion 7 is removed to set the thickness of the encapsulation portion 7 to be predetermined. For example, the upper surface of the encapsulation portion 7 is grinded to set the thickness of the encapsulation portion 7 to be predetermined.

Figure 6A:
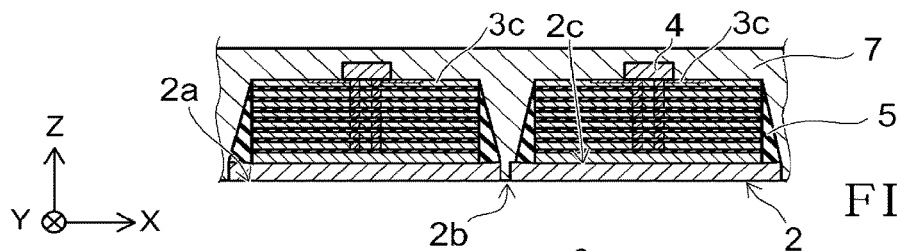
FIGS. 6A to 6E are schematic process views illustrating the method of fabricating the semiconductor device according to the second embodiment.

As illustrated in FIG. 6A, a surface of the substrate 2 on the opposite side to a side on which the stacked bodies 30 are provided, is removed to expose the grooves 2a and the grooves 2b. The surface of the substrate 2 on the opposite side to the side described above on which the stacked bodies 30 are provided, is grinded to expose to the grooves 2a and the grooves 2b, for example. In the above case, providing the encapsulation portion 7 in the grooves 2a and the grooves 2b makes it possible to terminate the processing at the point where the encapsulation portion 7 is exposed.

Figure 6B:
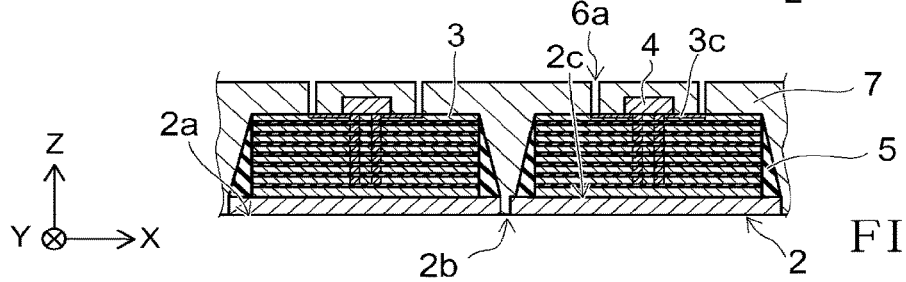

As illustrated in FIG. 6B, through holes 6a for forming the through via electrodes 6 are provided at predetermined positions on the upper surface of the encapsulation portion 7. The through via electrodes 6 are provided in the through holes 6a as will be described later. The through holes 6a are thus provided at positions where the through via electrodes 6 and interconnections 3c are to be electrically connected to one another. The through holes 6a are provided by using, for example, laser boring or the like. At least any of the grooves 2a, the grooves 2b, and a contour of the region 2c is used as a mark for alignment in the formation of the through holes 6a. Accordingly, the through holes 6a can be easily provided at appropriate positions.

Figure 6C:
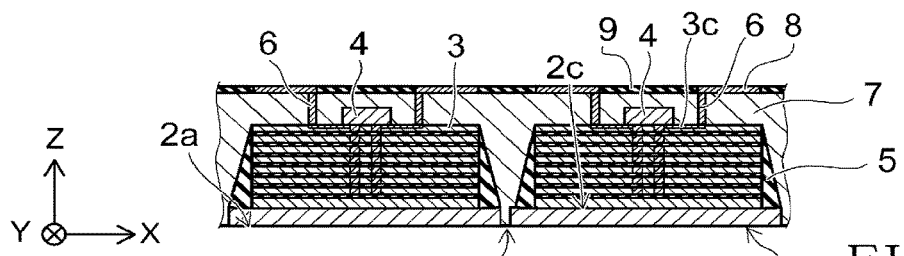

Next, as illustrated in FIG. 6C, the through via electrodes 6 are provided in the through holes 6a. The through via electrodes 6 are provided by using, for example, plating, PVD, or the like. Then, an interconnection layer 8 and an insulating layer 9 are provided on the upper surface of the encapsulation portion 7. The interconnection layer 8 is electrically connected to upper end surfaces of the through via electrodes 6. The insulating layer 9 is provided between portions of the interconnection layer 8 and electrically isolates between the portions of the interconnection layer 8 from one another. Note that the through via electrodes 6 and the interconnection layer 8 may be provided separately or together in single operation. In the embodiment, at least any of the grooves 2a, the grooves 2b, and the contour of the region 2c is used as the alignment mark in the formation of the interconnection layer 8 and the insulating layer 9. Accordingly, the position accuracy of the interconnection layer 8 and the insulating layer 9 can be improved.

Figure 6D:
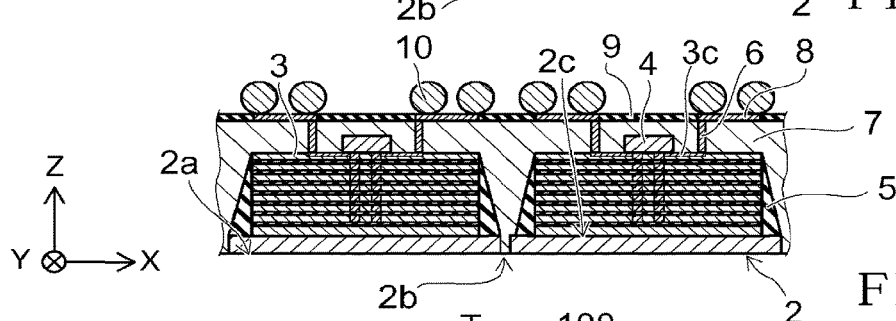

Next, as illustrated in FIG. 6D, external connection terminals 10 are provided on the interconnection layer 8. In the above case, the external connection terminals 10 are provided in a way similar to that illustrated in FIG. 3D. The semiconductor devices 1 are thereby integrally fabricated.

Figure 6E:
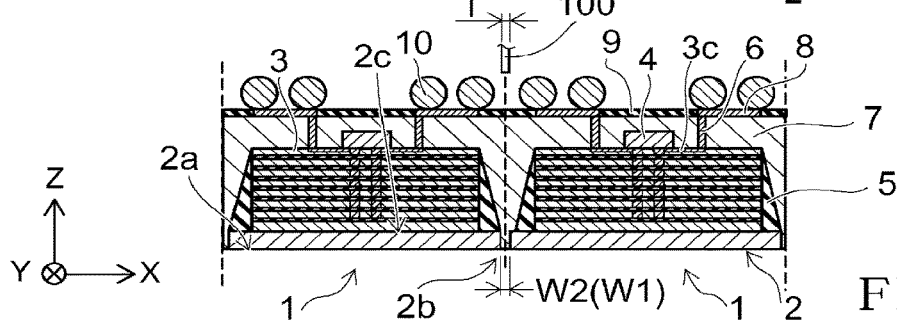

As illustrated in FIG. 6E, the semiconductor devices 1 are diced into individual chips. In the above case, the semiconductor devices 1 are diced into individual chips in a way similar to that illustrated in FIG. 3E. Effects similar to those illustrated in FIG. 3E are also obtained in the second embodiment as same as the first embodiment. Moreover, the semiconductor device 1 illustrated in FIG. 4 can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of fabricating a semiconductor device, comprising:
    stacking a plurality of semiconductor chips on each of regions in a substrate having a plurality of first grooves extending in a first direction and a plurality of second grooves extending in a second direction intersecting the first direction, the region being defined by the first grooves and the second grooves;
    filling gaps between the semiconductor chips with an underfill resin, wherein the underfill resin adhered to a side surface of the semiconductor chips is suppressed from flowing out to the adjacent region by at least any of the first grooves and the second grooves;
    forming a through via electrode electrically connected with a top portion of which the semiconductor chips are stacked;
    providing an encapsulation portion covering a side of the substrate on which the semiconductor chips are stacked;
    removing an upper surface of the encapsulation portion on the opposite side to the substrate side to expose an upper end surface of the through via electrode;
    removing a surface portion of the substrate on the opposite side to the side on which the semiconductor chips are stacked to expose the first grooves and the second grooves; and
    cutting the encapsulation portion along the first grooves and of the second grooves.

2. The method of claim 1,
    wherein the encapsulation portion is cut by using a blade having a thickness smaller than a width of the first grooves and a width of the second grooves in the cutting of the encapsulation portion.

3. The method of claim 1, wherein
    at least any of the first grooves, the second grooves, and contours of the regions is employed as alignment marks in the stacking of the semiconductor chips.

4. The method of claim 1, further comprising
    providing an interconnection layer on a surface of the encapsulation portion on the opposite side to the substrate side, the interconnection layer being electrically connected to the semiconductor chips stacked, wherein
    the interconnection layer is provided by using at least any of the first grooves, the second grooves, and contours of the regions as alignment marks.

5. The method of claim 1, wherein
    the semiconductor chips and the substrate contain silicon.

6. A method of fabricating a semiconductor device, comprising:
    stacking a plurality of semiconductor chips on each of regions in a substrate having a plurality of first grooves extending in a first direction and a plurality of second grooves extending in a second direction intersecting the first direction, the region being defined by the first grooves and the second grooves;
    filling gaps between the semiconductor chips with an underfill resin, wherein the underfill resin adhered to a side surface of the semiconductor chips is suppressed from flowing out to the adjacent region by at least any of the first grooves and the second grooves;
    providing an encapsulation portion covering a side of the substrate on which the semiconductor chips are stacked;
    removing a surface portion of the substrate on the opposite side to the side on which the semiconductor chips are stacked to expose the first grooves and the second grooves;
    providing a through hole at predetermined position on the upper surface of the encapsulation portion;
    providing a through via electrode in the through hole to electrically connect with a top portion of which the semiconductor chips are stacked; and
    cutting the encapsulation portion along the first grooves and of the second grooves.

7. The method of claim 6,
    wherein the encapsulation portion is cut by using a blade having a thickness smaller than a width of the first grooves and a width of the second grooves in the cutting of the encapsulation portion.

8. The method of claim 6, wherein
    at least any of the first grooves, the second grooves, and contours of the regions is employed as alignment marks in the stacking of the semiconductor chips.

9. The method of claim 6, further comprising
    providing an interconnection layer on a surface of the encapsulation portion on the opposite side to the substrate side, the interconnection layer being electrically connected to the semiconductor chips stacked, wherein
    the interconnection layer is provided by using at least any of the first grooves, the second grooves, and contours of the regions as alignment marks.

* * * * *